United States Patent
Bräunlich et al.

(10) Patent No.: US 7,901,223 B2
(45) Date of Patent: Mar. 8, 2011

(54) ELECTRONICS MODULE FOR AN INSTALLATION MODULE

(75) Inventors: Michael Bräunlich, Chemnitz (DE); Daniela Rochlitzer, Chemnitz (DE); Thomas Ott, Rochlitz (DE)

(73) Assignee: Siemens AG, München (DE)

( * ) Notice: Subject to any disclaimer, the term of this patent is extended or adjusted under 35 U.S.C. 154(b) by 0 days.

(21) Appl. No.: 12/633,250

(22) Filed: Dec. 8, 2009

(65) Prior Publication Data

US 2010/0144178 A1  Jun. 10, 2010

(30) Foreign Application Priority Data

Dec. 9, 2008  (EP) .................................... 08021383

(51) Int. Cl.
*H01R 13/44* (2006.01)
(52) U.S. Cl. ........................................................ 439/135
(58) Field of Classification Search .................. 439/135, 439/137, 700, 219, 860, 188, 140; 200/50.27, 200/51 R
See application file for complete search history.

(56) References Cited

U.S. PATENT DOCUMENTS

| | | | | |
|---|---|---|---|---|
| 4,911,643 A | * | 3/1990 | Perry et al. | 439/67 |
| 6,696,654 B2 | * | 2/2004 | Ashani et al. | 200/307 |
| 2002/0123256 A1 | * | 9/2002 | Brickett | 439/140 |
| 2007/0167089 A1 | * | 7/2007 | Gobron et al. | 439/860 |
| 2009/0223799 A1 | * | 9/2009 | Follingstad et al. | 200/51 R |
| 2010/0062629 A1 | * | 3/2010 | Feldman et al. | 439/219 |

FOREIGN PATENT DOCUMENTS

| | | |
|---|---|---|
| EP | 1 282 346 | 2/2003 |
| EP | 1 524 889 | 4/2005 |
| EP | 1 583 408 | 10/2005 |

* cited by examiner

*Primary Examiner* — Jean F Duverne
(74) *Attorney, Agent, or Firm* — Cohen Pontani Lieberman & Pavane LLP

(57) ABSTRACT

An electronics module configured to be plugged into an installation module having an isolating element which is operated by an operating means to close and open a circuit during an insertion process and withdrawal process, respectively, wherein the isolating element includes a first connection having a first contact area, a second connection having a second contact area, and a closing element having a third contact area and a fourth contact area. The closing element is arranged in a disconnected position such that a first isolation separation is provided between the first contact area and the third contact area, and a second isolation separation is provided between the second contact area and the fourth contact area.

12 Claims, 2 Drawing Sheets

ELECTRONICS MODULE FOR AN INSTALLATION MODULE

BACKGROUND OF THE INVENTION

1. Field of the Invention

The invention relates to an electronics module and, more particularly, to an electronics module that is configured to be plugged into an installation module, having an isolating element, which is operated via an operating means during an insertion process and a withdrawal process, respectively.

2. Description of the Related Art

In automation components that are used in an environment having a risk of explosions, electronics modules must be electrically deactivated before they can be removed from an installation module. Open spark gaps are thus avoided, in which case, in order to use electronics modules in explosive conditions, relatively large isolation separations, e.g., from about 2 to 3 mm, must be maintained for voltages of 10 to 30 volts to obtain safe disconnections of circuits, even at relatively low voltages.

In conventional electronics modules, a sliding contact spring is mounted on the operating means. The contract spring bridges two tin contact surfaces on a printed circuit board and thus connects the electronics module. This conventional design is disadvantageous in that this way of making contact is susceptible to wear. Contact problems can occur due to oxidation and wear on the contacts, caused by severe industrial environmental conditions such as dust, chemical substances, aggressive gases and vibration.

Moreover, compliance with predetermined isolation separations makes the design of an isolating element more difficult, when the assembly is subject to certain requirements and, in the case of isolating conventional elements with switches, it is necessary to make use of a large disproportionately shaped physical form because of the large isolation separations.

SUMMARY OF THE INVENTION

It is therefore an object of the invention to provide an electronics module which has a smaller isolating element.

This and other objects and advantages are achieved by providing an isolating element that has a first connection with a first contact area, a second connection with a second contact area, a closing element with a third contact area and a fourth contact area, where the closing element is arranged in a disconnected position such that a first isolation separation is provided between the first contact area and the third contact area, and a second isolation separation is provided between the second contact area and the fourth contact area.

In accordance with the invention, a specific isolation gap is split by a specific isolation separation distance into a first gap element having a first isolation separation distance and into a second gap element having a second isolation separation distance such that two contact areas are located alongside one another. As a result, the physical form of the isolating element can be kept small. The circuit to be interrupted is now no longer interrupted by a conventional switching element at only one point but, rather, the circuit is simultaneously interrupted at two points, where each of these two points can provide a proportion of the required isolation separation.

In an advantageous embodiment, the closing element is movably arranged such that it can move from the disconnected position to a closed position. In the case of the electronics module, unlocking of the electronics module from the installation module is preferably additionally provided via the operating means. Consequently, the movement path of the operating means for module unlocking is used to move the closing element from the disconnected position to a closed position. Here the required isolation gap and the required isolation separation has been split between the two previously mentioned gap elements, taking into account the physical forms thereof, with an additionally shorter distance of movement.

In another advantageous embodiment, the closing element is arranged within a guide means. Here, the mechanical requirements for safe disconnection of the contacts, such as stability and low susceptibility to defects, are made possible by guidance of the closing element, for example, in a plastic housing. The guide means also allow accurate positioning of the closing element with respect to the operating means.

In a further optimized embodiment, the closing element is U-shaped, and a first limb is connected via a center part to a second limb. This closing element, which comprises a bracket, preferably represents a short-circuiting clip that remains in the guide of a housing comprising non-conductive material during a switching process. Low insertion and withdrawal forces during the switching process are advantageously noticeable, because force is introduced centrally on the center part of the closing element.

In another embodiment, the first and the second contact areas are advantageously configured to respectively hold the third and fourth contact areas, such that they at least partially surround them to further reduce the above described contact problems. The first connection and the second connection respectively have a first and a second contact area which, for example, comprise a fork shaped contact in which the third and fourth contact areas of the switching element can be inserted and are held securely by spring loading of the contact areas, which are designed in the form of forks, of the first and second connections.

In another advantageous embodiment, the center part includes a pin for guiding the closing element over the operating means. Here, the pin can advantageously be introduced into a guide groove in the operating means and can, thus, be moved precisely from the disconnected position to the closed position by the operating means.

In another embodiment, the first connection, the second connection, the closing element and the guide means form a physical unit for increasing the robustness of an isolating element within the electronics module. Because of the severe mechanical environmental conditions, such as those that occur in industrial automation, it is worthwhile because of the mechanical requirement for robustness and low susceptibility to defects to preferably accommodate the components required for this purpose in a robust plastic housing as a physical unit.

In a further improved embodiment, the first and the second connections are formed on a side opposite to the contact area as angled solder pins for soldering onto a printed circuit board. For example, permanently encapsulated first and second connecting legs can be angled to correspond to a housing shape of the physical unit such that they are soldered to solder pads that are arranged on a conductor track and therefore simultaneously provide mechanical robustness for the electrical connection.

In an embodiment in which robustness is further enhanced, the isolating element includes additional solder pins for attachment. These additional solder pins are preferably arranged in corner areas of the isolating element to ensure additional robustness against sliding or vibration. In turn, the additional solder pins can preferably be permanently encapsulated by a plastic housing, and in this case generally have no electrical function, but only a robustness effect.

It another advantageous embodiment, the isolating element has a housing and a stabilizer is arranged thereon to position the isolating element on the printed circuit board, where the housing and the stabilizer engage the printed circuit board. For example, the contemplated stabilizers may comprise plastic pins on the housing that can then engage with corresponding holes on a printed circuit board to which the isolating element is fitted, and thus ensure secure retention even when the electronics modules are subjected to vibrational and shock loads.

In yet another advantageous embodiment, the operating means includes decoupling means for reducing mechanical couplings into the isolating element. For example, the movement can be mechanically coupled from the operating means to the closing element via a broad guide groove that is located in the operating means and engages with the pin on the center part. As a consequence, even in a load state resulting from extreme vibration of the installation module, little to no vibration is transmitted to the contact areas and the corresponding opposing contact areas of the closing element in the isolating element via the operating means. As a result, the contact surfaces are prevented from becoming worn.

Other objects and features of the present invention will become apparent from the following detailed description considered in conjunction with the accompanying drawings. It is to be understood, however, that the drawings are designed solely for purposes of illustration and not as a definition of the limits of the invention. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The various features, functions and advantages characterizing the invention will be better understood by reference to the detailed description which follows, taken in conjunction with the accompanying drawings, in which.

DETAILED DESCRIPTION OF THE PRESENTLY PREFERRED EMBODIMENTS

Figure 1:
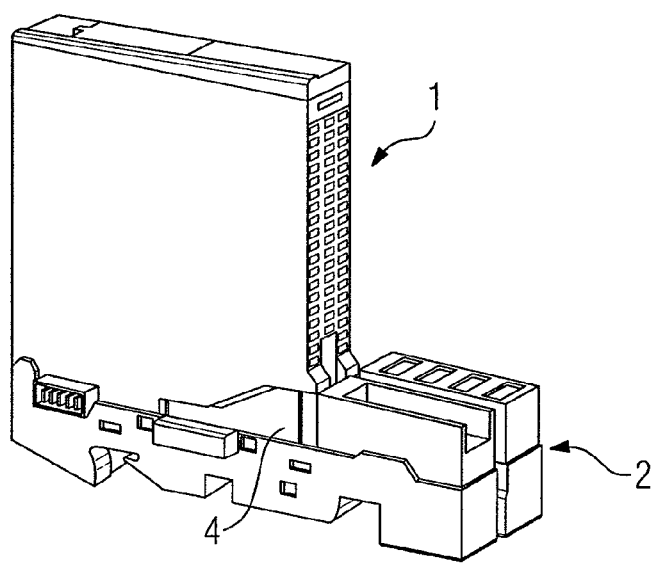
FIG. 1 shows an electronics module and an installation module in accordance with the invention.

FIG. 1 shows an electronics module 1 inserted in an installation module 2. The electronics module 1 is configured such that it can be plugged into and latched to the installation module 2. During an insertion process, an operating means 4 is moved and coupled to an isolating element 3 (see, e.g., FIGS. 2 to 5). By way of example, such electronics modules 1 are used to form modular control systems or to form decentralized peripheral systems for process automation. The installation modules 2 are suitable for connection to an adjacent installation module. An installation module 2 is therefore provided with an interface to the electronics module 1, as well as contacts on both sides for control signals, which are electrically connected to one another within the installation module and includes electrical connections to the interface of the electronics module.

Figure 2:
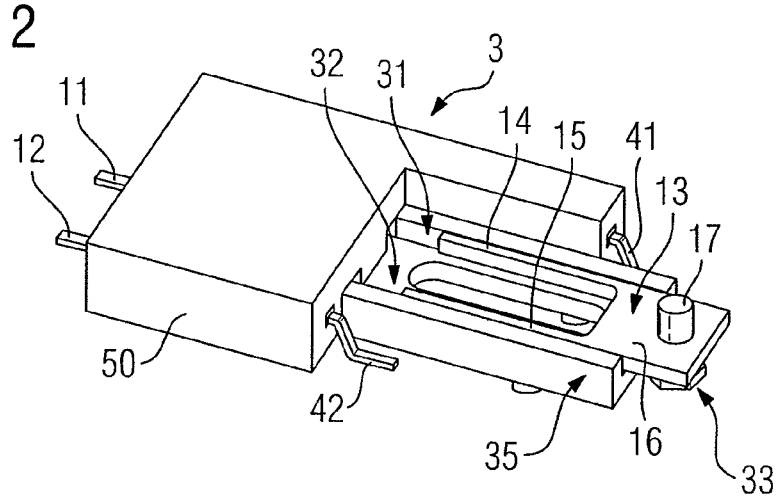
FIG. 2 shows an isolating element with a closing element in a disconnected position in accordance with the invention.

FIG. 2 shows an isolating element 3 for closing and opening a circuit for the electronics module 1 shown in FIG. 1. Normally, the isolating element 3 is fitted in the electronics module 1. The isolating element 3 includes a plastic housing 50 from which a first connection 11, a second connection 12, a first additional solder pin 41 and a second additional solder pin 42 project as connecting points. Here, the first connection 11 and the second connection 12 are the connection to the circuit that is to be disconnected and to be closed, respectively.

Figure 3:
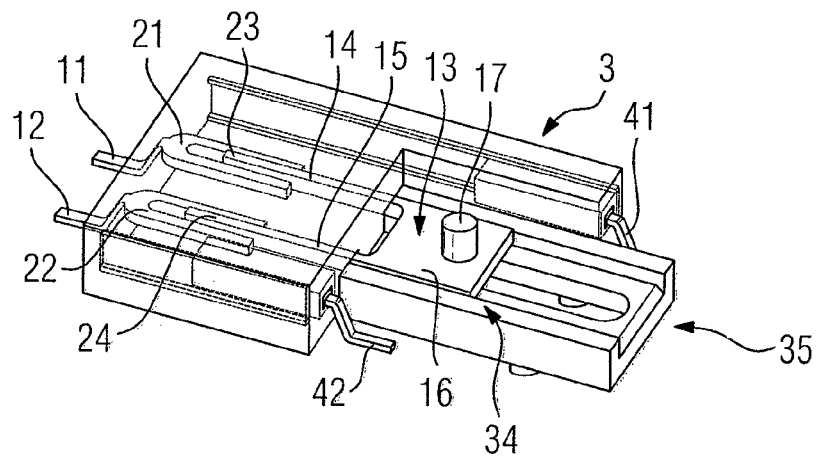
FIG. 3 shows the isolating element with the closing element in a closed position in accordance with the invention.

FIG. 2 shows the isolating element 3 with a housing 50 illustrated in a form in which it cannot be seen directly through. Consequently, FIG. 3 is provided to better illustrate the process of moving a closing element 13 inwardly and outwardly. With specific reference to FIG. 3, shown therein is the isolating element 3 with the housing 50 illustrated in a manner that provides a view of the interior of the isolating element. Returning to FIG. 2, the closing element 13 is shown located in a disconnected position 33. At this disconnected position 33, the closing element 13, which comprises a first limb 14, a second limb 15 and a center part 16, is located in a guide means 35. Together with the guide means 35, the closing element 13 is configured such that it can be moved from the disconnected position 33 to a closed position 34 (see FIG. 3).

In the disconnected position 33, a first contact area 21, which is connected to the first connection 11, is opposite a third contact area 23 of the first limb 14 and forms a first isolation separation 31 between the first contact area 21 and the third contact area 23. A second contact area 22, which is connected to the first connection 11, is located opposite a fourth contact area 24 of the second limb 15 having a second isolation separation 32. The first connection 11 and the second connection 12 are therefore not electrically connected to one another and cannot close the circuit when the switching element 13 is in the disconnected position 33. An isolation gap, which is provided specifically for the use of an electronics module 1 in an area where there is a risk of explosion, between contacts that disconnect the circuit and close the circuit is split into two gap elements by the arrangement of the switching element 13 for the first and second contact areas 21, 22 of the first connection 11 and of the second connection 12. A change between the disconnected position 33 and the closed position 34 of the closing element 13 can be seen by comparison of FIG. 2 with FIG. 3, and vice versa.

With reference to FIG. 3, the closing element 13 is shown in a closed position 34. Here, the first limb 14 is embedded with its third contact area 23 in the first contact area 21 of the first connection 11, and the fourth contact area 24 of the second limb 15 is embedded in the second contact area 22 of the second connection 12. The circuit via the first connection 11 and the second connection 12, by means of the U-shaped switching element 13, is closed by insertion of the third and fourth contact areas 23, 24 into the first and second contact areas 21, 22, respectively.

A main part of the housing 50 is I-shaped and includes insertion openings for inserting the first limb 14 and the second limb 15 into the housing interior, with the first contact area 21 and the second contact area 23 comprising a fork shaped contact element and being arranged opposite the insertion openings for holding the third and fourth contact areas 23, 24 of the switching element 13. The guide means 35 comprises a guide rail having an elongated hole, which can reliably guide the rectangular center part 16 of the switching element 3 for linear movement. Here, the guide means 35 includes guide rails on both sides, which are configured such that the switching element 13 is captively connected to the guide means 35.

With continued reference to FIG. 3, the center part 16 includes a pin 17 that is used as a point of action for the operating means 4 to move the closing element 13 from the disconnected position 33 to the closed position 34.

Figure 4:
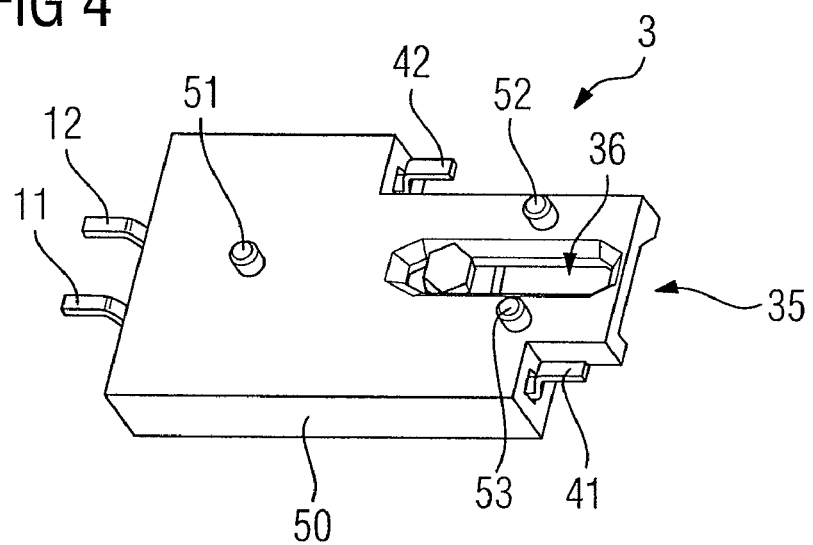
FIG. 4 shows a view of a lower face of the isolating element of FIGS. 2 and 3.
Figure 5:
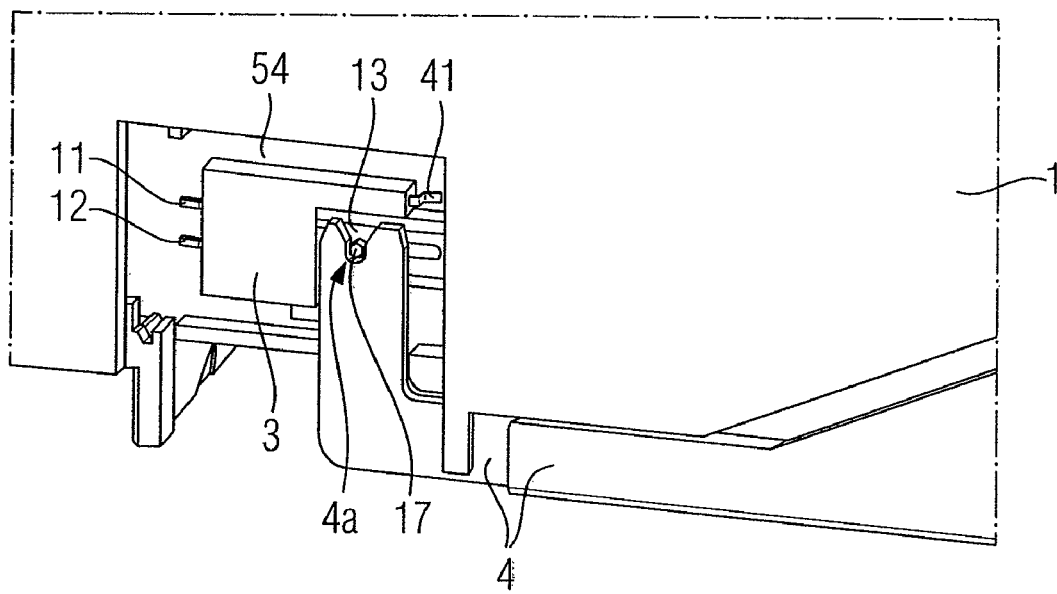
FIG. 5 shows a detail view of the electronics module of FIG. 1 with the housing cut away at the location of the isolating element in accordance with the invention.

FIG. 4 shows a rear view of the isolating element 3 shown in FIGS. 2 and 3. With reference to FIG. 4, the first connection 11, the second connection 12, the first additional solder pin 41 and the second additional solder pin 42 comprise angled solder pins for soldering onto a printed circuit board 54 (see FIG. 5). In the rear view of the isolating element 3, the elongated hole 36 that is provided for the guide means 35 is provided with chamfered edges. Here, the opposite side of the pin 17 has a knob that can move in the elongated hole 36 along the chamfered edges without any play, and therefore contributes to exact positioning of the switching element 13 and to the captive nature of the switching element 13. The angled contact pins are firmly soldered to corresponding opposing surfaces on a printed circuit board 54 to make contact between the isolating element 3 and a printed circuit board 54, as shown in FIG. 5. Moreover, the lower face of the housing 50 includes a first stabilizer 51, a second stabilizer 52 and a third stabilizer 53 to provide additional robustness, particularly for industrial use of the electronics module 1. Here, the stabilizers 51, 52, 53 comprise truncated shafts, and are placed in appropriate holders in the printed circuit board 54. The additional stabilizers 51, 52, 53 further reduce the susceptibility of the isolating element 3 to vibration.

FIG. 5 shows the isolating element 3 in a position installed on the printed circuit board 54 of the electronics module 1. With reference to FIG. 5, the electronics module 1 is shown in enlarged detail, i.e., a detail of the entire electronics module 1. Here, FIG. 5 shows a cutaway view of an electronics module housing to illustrate the installation point of the isolating element 3. The first connection 11 is soldered by its angled solder pin to the printed circuit board 54. The solder pins for the second connection 12 and the first additional solder pin 41 are similarly soldered to the printed circuit board 54.

The operating element 4 is arranged such that it is connected via the pin 17 to the switching element 13 by a decoupling means 4a. The decoupling means 4a comprises a broad guide groove for mechanically decoupling the movement of the operating means 4. Consequently, any shaking or loading shock is therefore advantageously not transmitted to the switching element 13. As a result, even in a loaded state, the switching element 13 remains with its third and fourth contact areas 23, 24 in the correspondingly fork-shaped contact areas 21, 22 of the first and second connections 11, 12. By providing the decoupling means 4a, it becomes possible to provide a required isolation gap for use in environments where there is a risk of an explosion, i.e., by splitting the isolation gap into a first gap element and a second gap element even for an isolating element 3 which would have a greater physical extent in comparison to a further isolating element having only one isolation gap.

Thus, while there are shown, described and pointed out fundamental novel features of the invention as applied to preferred embodiments thereof, it will be understood that various omissions and substitutions and changes in the form and details of the illustrated apparatus, and in its operation, may be made by those skilled in the art without departing from the spirit of the invention. Moreover, it should be recognized that structures shown and/or described in connection with any disclosed form or embodiment of the invention may be incorporated in any other disclosed or described or suggested form or embodiment as a general matter of design choice.

What is claimed is:

1. An electronics module configured to be plugged into an installation module, comprising:
   an operating means for closing and opening a circuit during a respective insertion process and withdrawal process of the electronics module into and out of the installation module; and
   an isolating element which is operated by the operating means,
   the isolating element comprising:
      a first connection having a first contact area;
      a second connection having a second contact area; and
      a closing element having a third contact area and a fourth contact area, the closing element being arrangeable in a disconnected position such that a first isolation separation is provided between the first contact area and the third contact area, and a second isolation separation is provided between the second contact area and the fourth contact area.

2. The electronics module as claimed in claim 1, wherein the closing element is configured to move from the disconnected position to a closed position in which the first and second isolation separations are closed.

3. The electronics module as claimed in claim 2, wherein the closing element is arranged within a guide means which guides movement of the closing element between the disconnected position and the closed position.

4. The electronics module as claimed in claim 1, wherein the closing element is U-shaped and comprises a center part, a first limb connected to the center part and a second limb which is connected by the center part to the second limb.

5. The electronics module as claimed in one of claim 2, wherein the first contact area and the second contact area are configured to respectively hold the third contact and fourth contact area of the closing element when the closing element is in the closed position such that the third contact and fourth contact area at least partially surround the first contact and the second contact area.

6. The electronics module as claimed in claim 4, wherein the center part includes a pin for guiding the closing element by the operating means.

7. The electronics module as claimed in claim 5, wherein the center part includes a pin for guiding the closing element by the operating means.

8. The electronics module as claimed in claim 3, wherein the first connection, the second connection, the closing element and the guide means form a physical unit.

9. The electronics module as claimed in claim 1, wherein the first connection and the second connection are formed as angled solder pins for soldering onto a printed circuit board and are arranged on a side opposite the first contact area and the second contact area.

10. The electronics module as claimed in claim 9, wherein the isolating element further comprises additional solder pins for attachment.

11. The electronics module as claimed in claim 1, wherein the isolating element further comprises a housing and a stabilizer arranged thereon, the stabilizer engaging with a printed circuit board of the electronics module, thereby positioning the isolating element on the printed circuit board.

12. The electronics module as claimed claim 1, wherein the operating means includes decoupling means for reducing mechanical couplings into the isolating element.

\* \* \* \* \*